(12) United States Patent
Zanbaghi et al.

(10) Patent No.: US 9,941,848 B1
(45) Date of Patent: Apr. 10, 2018

(54) TRANSCONDUCTANCE WITH CAPACITANCES FEEDBACK COMPENSATION AMPLIFIER

(71) Applicant: Cirrus Logic, Inc., Austin, TX (US)

(72) Inventors: Ramin Zanbaghi, Austin, TX (US); Aaron Brennan, Austin, TX (US); Johann Gaboriau, Austin, TX (US); Prashanth Drakshapalli, Austin, TX (US); Vamsikrishna Parupalli, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 235 days.

(21) Appl. No.: 14/520,060

(22) Filed: Oct. 21, 2014

(51) Int. Cl.
*H03F 1/34* (2006.01)
*H03F 3/187* (2006.01)
*H03F 1/02* (2006.01)

(52) U.S. Cl.
CPC ............ *H03F 3/187* (2013.01); *H03F 1/02* (2013.01); *H03F 2200/03* (2013.01); *H03F 2200/54* (2013.01)

(58) Field of Classification Search
CPC ............ H03F 1/32; H03F 2003/4504; H03F 2003/45053; H03F 3/456; H03F 2200/129; H03F 2200/135; H03F 2200/141; H03F 2200/144
USPC ....... 330/75–76, 82, 84, 85–86, 88, 90–100, 330/103, 200, 260, 265, 271, 282, 330/291–293
See application file for complete search history.

(56) References Cited

U.S. PATENT DOCUMENTS

2014/0132341 A1* 5/2014 Wang .................. H03F 1/14
330/69

OTHER PUBLICATIONS

Peng et al., "Transconductance with Capacitances Feedback Compensation for Multistage Amplifiers", IEEE Journal of Solid-State Circuits, vol. 40, No. 7, Jul. 2005, pp. 1514-1520.*
Lee et al., "Active-Feedback Frequency-Compensation Technique for Low-Power Multistage Amplifiers", IEEE Journal of Solid-State Circuits, vol. 38, No. 3, Mar. 20, pp. 511-520.*
Murmann, Borris, "Digitally Assisted Analog Circuits", IEEE Computer Society publication, Mar.-Apr. 2006, pp. 37-48.*
Texas Instrument's product "TPA6139A2" data sheet Revised in Jun. 2012.*
Surkanti et al., "Bias-Line Compensation in Multi-Stage Amplifiers", 2011 IEEE 54th International Midwest Symposium on Circuits and Systems (MWSCAS), Seoul, Korea, Aug. 2011, pp. 1-4).*
Definition of "parallel", The New IEEE Standard Dictionary of Electrical and Electronics Terms, 5th Ed., p. 914 (1993).
Nilsson, James W. et al., Electric Circuits, 5th Ed.(1996), p. 65.

* cited by examiner

Primary Examiner — Steven J Mottola
Assistant Examiner — Hafizur Rahman
(74) *Attorney, Agent, or Firm* — Jackson Walker L.L.P.

(57) ABSTRACT

In accordance with embodiments of the present disclosure, a transconductance with capacitances feedback compensation amplifier may include a capacitor in parallel with an inner feedback loop of the amplifier for providing cascade compensation to the amplifier.

16 Claims, 2 Drawing Sheets

TRANSCONDUCTANCE WITH CAPACITANCES FEEDBACK COMPENSATION AMPLIFIER

FIELD OF DISCLOSURE

The present disclosure relates in general to circuits for audio devices, including without limitation personal audio devices such as wireless telephones and media players, and more specifically, to transconductance with capacitances feedback compensation (TCFC) amplifier.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers. Oftentimes, such power amplifier is implemented using a transconductance with capacitances feedback compensation (TCFC) amplifier.

SUMMARY

In accordance with the teachings of the present disclosure, one or more disadvantages and problems associated with existing approaches to design of TCFC amplifiers may be reduced or eliminated.

In accordance with embodiments of the present disclosure, a TCFC amplifier comprises a first gain stage, a second gain stage, and a third gain stage, an outer feedback loop including a first capacitor, an inner feedback loop, and a second capacitor. The first gain stage may have a first gain stage input and a first gain stage output and may be configured to receive an input signal at the first gain stage input and apply a first gain to the input signal to generate a first gain stage output signal at the first gain stage output. The second gain stage may have a second gain stage input and a second gain stage output and may be configured to receive the first gain stage output signal at the second gain stage input and apply a second gain to the first gain stage output signal to generate a second gain stage output signal at the second gain stage output. The third gain stage may have a third gain stage input and a third gain stage output and may be configured to receive the second gain stage output signal at the third gain stage input and apply a third gain to the second gain stage output signal to generate a third gain stage output signal at the third gain stage output. The outer feedback loop may include a first capacitor coupled between the second gain stage input and the third gain stage output. The inner feedback loop may be coupled between the third gain stage input and the third gain stage output and configured to provide cascade compensation between the third gain stage input and the third gain stage output. The second capacitor may be coupled between the third gain stage input and the third gain stage output.

In accordance with these and other embodiments of the present disclosure, an integrated circuit may include a first path portion and a second path portion. The first path portion may include a transconductance with capacitances feedback compensation amplifier having first gain stage, a second gain stage, and a third gain stage, an outer feedback loop including a first capacitor, an inner feedback loop, and a second capacitor. The first gain stage may have a first gain stage input and a first gain stage output and may be configured to receive an input signal at the first gain stage input and apply a first gain to the input signal to generate a first gain stage output signal at the first gain stage output. The second gain stage may have a second gain stage input and a second gain stage output and may be configured to receive the first gain stage output signal at the second gain stage input and apply a second gain to the first gain stage output signal to generate a second gain stage output signal at the second gain stage output. The third gain stage may have a third gain stage input and a third gain stage output and may be configured to receive the second gain stage output signal at the third gain stage input and apply a third gain to the second gain stage output signal to generate an output signal at the third gain stage output. The outer feedback loop may include a first capacitor coupled between the second gain stage input and the third gain stage output. The inner feedback loop may be coupled between the third gain stage input and the third gain stage output and configured to provide cascade compensation between the third gain stage input and the third gain stage output. The second capacitor may be coupled between the third gain stage input and the third gain stage output.

In accordance with these and other embodiments of the present disclosure, a personal audio device may include an audio transducer and a signal path. The audio transducer may be configured to generate sound in accordance with an output signal received by the audio transducer. The signal path may be coupled to the audio transducer, and may include a first path portion and a second path portion. The first path portion may include a transconductance with capacitances feedback compensation amplifier having a first gain stage, a second gain stage, and a third gain stage, an outer feedback loop including a first capacitor, an inner feedback loop, and a second capacitor. The first gain stage may have a first gain stage input and a first gain stage output and may be configured to receive an input signal at the first gain stage input and apply a first gain to the input signal to generate a first gain stage output signal at the first gain stage output. The second gain stage may have a second gain stage input and a second gain stage output and may be configured to receive the first gain stage output signal at the second gain stage input and apply a second gain to the first gain stage output signal to generate a second gain stage output signal at the second gain stage output. The third gain stage may have a third gain stage input and a third gain stage output and may be configured to receive the second gain stage output signal at the third gain stage input and apply a third gain to the second gain stage output signal to generate an output signal at the third gain stage output. The outer feedback loop may include a first capacitor coupled between the second gain stage input and the third gain stage output. The inner feedback loop may be coupled between the third gain stage input and the third gain stage output and configured to provide cascade compensation between the third gain stage input and the third gain stage output. The second capacitor may be coupled between the third gain stage input and the third gain stage output.

In accordance with these and other embodiments of the present disclosure, a method may include applying a first gain to an input signal to generate a first gain stage output signal at a first gain stage output of a first gain stage having a first gain stage input and the first gain stage output. The method may also include applying a second gain to the first gain stage output signal to generate a second gain stage output signal at a second gain stage output of a second gain stage having a second gain stage input and the second gain stage output. The method may further include applying a third gain to the second gain stage output signal to generate a third gain stage output signal at a third gain stage output of a third gain stage having a third gain stage input and the first gain stage output. The method may additionally include applying a first feedback between the second gain stage input and the third gain stage output with a first capacitor. The method may also include applying a second feedback between the third gain stage input and the third gain stage output and using cascade compensation between the third gain stage input and the third gain stage output. The method may further include applying compensation with a second capacitor coupled between the third gain stage input and the third gain stage output.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

In accordance with embodiments of the present disclosure, an integrated circuit for use in an audio device, such as a personal audio device (e.g., mobile telephone, portable music player, tablet computer, personal digital assistant, etc.), may include a signal path having a digital path portion (e.g., an audio compressor) and an analog path portion (e.g., an audio expander). The analog path portion may include a TCFC amplifier to receive an analog signal generated by the digital path portion and apply a gain to the analog signal to generate an output signal, wherein said output signal may be communicated to a loudspeaker for playback and/or to other circuitry for processing.

Figure 1:
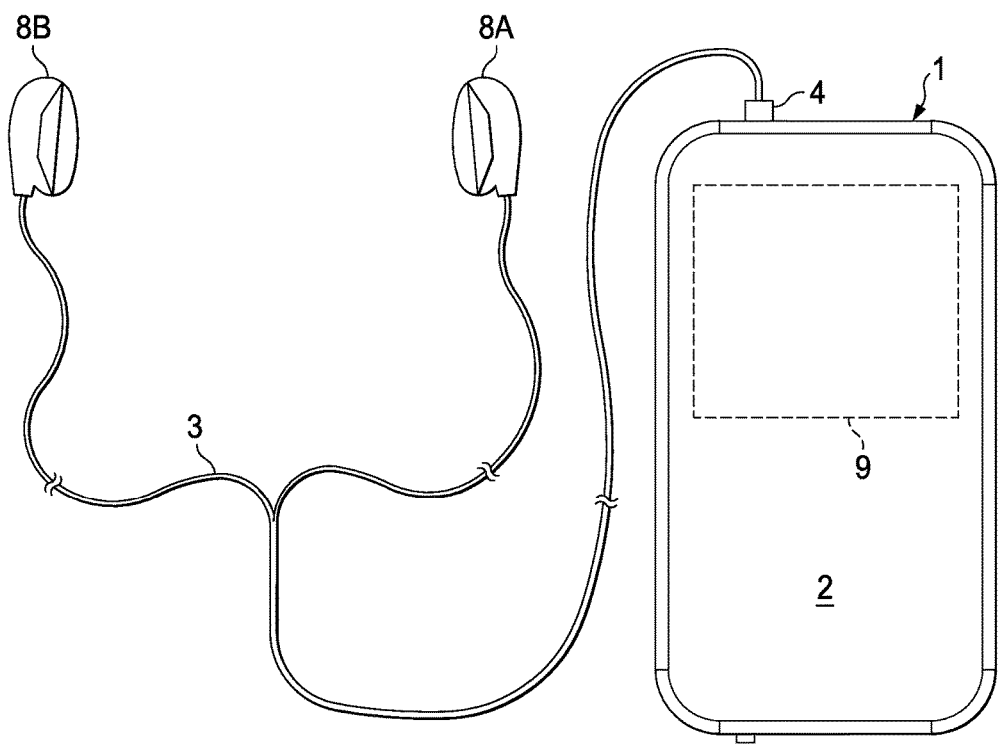
FIG. 1 is an illustration of an example personal audio device, in accordance with embodiments of the present disclosure.

The integrated circuit described above may be used in any suitable system, device, or apparatus, including without limitation, a personal audio device. FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2:
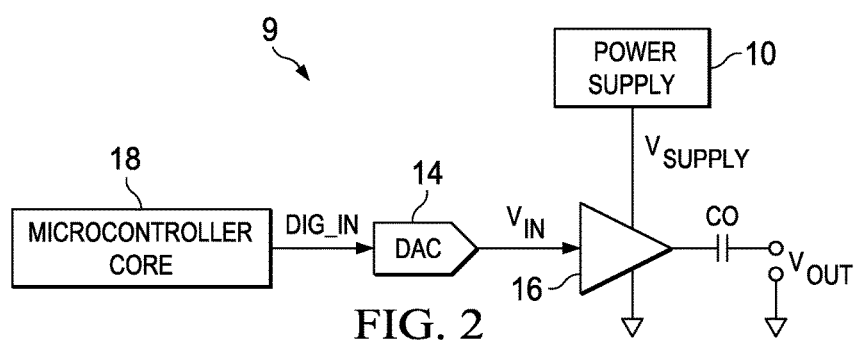
FIG. 2 is a block diagram of selected components of an example audio integrated circuit of a personal audio device, in accordance with embodiments of the present disclosure.

FIG. 2 is a block diagram of selected components of an example audio IC 9 of a personal audio device, in accordance with embodiments of the present disclosure. As shown in FIG. 2, a microcontroller core 18 may supply a digital audio input signal DIG_IN to a digital-to-analog converter (DAC) 14, which may convert the digital audio input signal to an analog signal $Y_{IN}$. DAC 14 may be referred to herein as a digital path portion of the signal path from the input node for digital audio input signal DIG_IN to the output node for output voltage signal $V_{OUT}$ depicted in FIG. 2.

DAC 14 may supply analog signal $Y_{IN}$ to an amplifier stage 16 which may amplify or attenuate audio input signal $Y_{IN}$ in conformity with a gain to provide an audio output signal $V_{OUT}$, which may operate a speaker, headphone transducer, a line level signal output, and/or other suitable output. Amplifier stage 16 may be referred to herein as an analog path portion of the signal path from the input node for digital audio input signal DIG_IN to the output node for output voltage signal $V_{OUT}$ depicted in FIG. 2. In the relevant art, amplifier stage 16 may sometimes be referred to as an audio expander. In some embodiments, amplifier stage 16 may comprise a TCFC amplifier, such as TCFC amplifier 30 shown in FIG. 3. In FIG. 2, a capacitor CO may be utilized to couple the output signal to the transducer or line level output, particularly if amplifier stage 16 is operated from a unipolar power supply having a quiescent voltage substantially differing from ground. A power supply 10 may provide the power supply rail inputs of amplifier stage 16.

Figure 3:
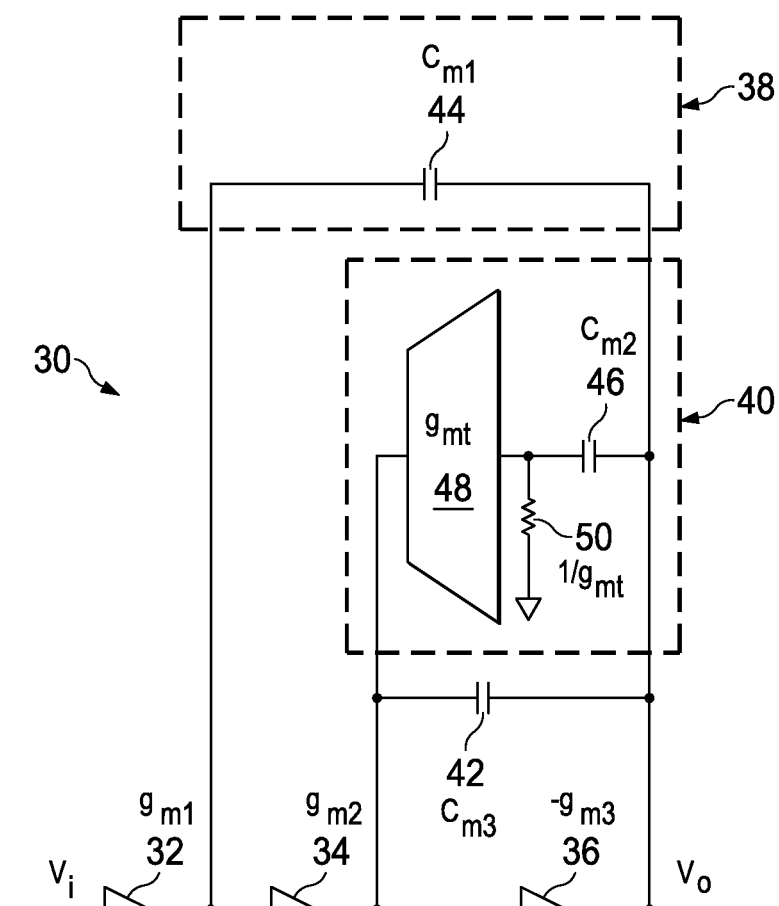
FIG. 3 is a block diagram of selected components of a TCFC amplifier for use in the audio integrated circuit of FIG. 2, in accordance with embodiments of the present disclosure.

FIG. 3 is a block diagram of selected components of a TCFC amplifier 30 which may be used as or as part of amplifier stage 16 of audio IC 9, in accordance with embodiments of the present disclosure. As shown in FIG. 3, TCFC amplifier 30 may include a first gain stage 32, a second gain stage 34, a third gain stage 36, an outer feedback loop 38, an inner feedback loop 40, and a capacitor 42.

First gain stage 32 may have a first gain stage input and a first gain stage output and may be configured to receive an input signal $V_i$ at the first gain stage input and apply a first gain $g_{m1}$ to input signal $V_i$ to generate a first gain stage output signal at the first gain stage output. When TCFC amplifier 30 is used as or part of amplifier stage 16 of FIG. 2, input signal $V_i$ may be analog signal $V_{IN}$ or a derivative thereof. In some embodiments, first gain stage 32 may be implemented as an operational amplifier. In these and other embodiments, first gain $g_{m1}$ may comprise a non-inverting gain. In these and other embodiments, gain $g_{m1}$ may comprise a transconductance gain.

Second gain stage 34 may have a second gain stage input and a second gain stage output and may be configured to receive the first gain stage output signal at the second gain stage input and apply a second gain $g_{m2}$ to the first gain stage output signal to generate a second gain stage output signal at the second gain stage output. In some embodiments, second gain stage 34 may be implemented as an operational amplifier. In these and other embodiments, second gain $g_{m2}$ may comprise a non-inverting gain. In these and other embodiments, gain $g_{m2}$ may comprise a transconductance gain.

Third gain stage 36 may have a third gain stage input and a third gain stage output and may be configured to receive the second gain stage output signal at the third gain stage input and apply a third gain to the second gain stage output signal to generate a third gain stage output signal $V_o$ at the third gain stage output. When TCFC amplifier 30 is used as or part of amplifier stage 16 of FIG. 2, audio output signal $V_{OUT}$ may be third gain stage output signal $V_o$ or a derivative thereof. In some embodiments, third gain stage 34 may be implemented as an operational amplifier. In these and other embodiments, third gain $g_{m3}$ may comprise an inverting gain (e.g., $-g_{m3}$). In these and other embodiments, gain $g_{m3}$ may comprise a transconductance gain.

Outer feedback loop 38 may include a capacitor 44 coupled between the second gain stage input and the third gain stage output. Inner feedback loop 40 may be coupled between the third gain stage input and the third gain stage output and may be configured to provide cascade compensation between the third gain stage input and the third gain stage output. In some embodiments, inner feedback loop 40 may include a capacitor 46, a feedback gain stage 48, and a resistor 50. Capacitor 46 may be coupled between the third gain stage output and a feedback gain stage input of feedback gain stage 48. Feedback gain stage 48 may have a feedback gain stage output coupled to the third gain stage input and configured to apply a feedback gain $g_{mt}$ to a signal present at the feedback gain stage input. In these and other embodiments, resistor 50 may be coupled between the feedback gain stage input and ground. In some embodiments, feedback gain $g_{mt}$ may comprise a transconductance gain, and resistor 50 may have a resistance equal to an inverse of feedback gain $g_{mt}$.

Capacitor 42 may be coupled between the third gain stage input and the third gain stage output. Addition of capacitor 42 to a traditional TCFC topology may provide for greater output signal stability and greater insensitivity to parasitic resistances and capacitances of the TCFC topology, and improve the gain transfer between input and output of TCFC amplifier 30.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. A transconductance with capacitances feedback compensation amplifier comprising:
   a first gain stage having a first gain stage input and a first gain stage output and configured to receive an input signal at the first gain stage input and apply a first gain to the input signal to generate a first gain stage output signal at the first gain stage output;
   a second gain stage having a second gain stage input and a second gain stage output and configured to receive the first gain stage output signal at the second gain stage input and apply a second gain to the first gain stage output signal to generate a second gain stage output signal at the second gain stage output;
   a third gain stage having a third gain stage input and a third gain stage output and configured to receive the second gain stage output signal at the third gain stage input and apply a third gain to the second gain stage output signal to generate a third gain stage output signal at the third gain stage output, wherein each of the first gain, the second gain, and the third gain comprises a transconductance gain;
   an outer feedback loop comprising a first capacitor coupled between the second gain stage input and the third gain stage output;
   an inner feedback loop coupled between the third gain stage input and the third gain stage output and configured to provide cascade compensation between the third gain stage input and the third gain stage output; and
   a second capacitor in parallel with the inner feedback loop and coupled between the third gain stage input and the third gain stage output.

2. The amplifier of claim 1, wherein the inner feedback loop comprises:
   a third capacitor coupled between the third gain stage output and a feedback gain stage input;
   a feedback gain stage having the feedback gain stage input and a feedback gain stage output coupled to the third gain stage input and configured to apply a feedback gain to a signal present at the feedback gain stage input; and
   a resistor coupled between the feedback gain stage input and ground.

3. The amplifier of claim 2, wherein the feedback gain is a transconductance gain, wherein the resistor has a resistance equal to an inverse of a gain of the feedback gain.

4. The amplifier of claim 1, wherein the first gain and the second gain are each a non-inverting gain and the third gain is an inverting gain.

5. An integrated circuit comprising:
   a first path portion comprising a transconductance with capacitances feedback compensation amplifier having:
      a first gain stage having a first gain stage input and a first gain stage output and configured to receive an analog input signal at the first gain stage input and apply a first gain to the input signal to generate a first gain stage output signal at the first gain stage output;
      a second gain stage having a second gain stage input and a second gain stage output and configured to receive the first gain stage output signal at the second gain stage input and apply a second gain to the first gain stage output signal to generate a second gain stage output signal at the second gain stage output;

a third gain stage having a third gain stage input and a third gain stage output and configured to receive the second gain stage output signal at the third gain stage input and apply a third gain to the second gain stage output signal to generate an output signal at the third gain stage output, wherein each of the first gain, the second gain, and the third gain comprises a transconductance gain;

an outer feedback loop comprising a first capacitor coupled between the second gain stage input and the third gain stage output;

an inner feedback loop coupled between the third gain stage input and the third gain stage output and configured to provide cascade compensation between the third gain stage input and the third gain stage output; and a second capacitor in parallel with the inner feedback loop and coupled between the third gain stage input and the third gain stage output; and a second path portion configured to convert a digital input signal into the analog input signal.

6. The integrated circuit of claim 5, wherein the inner feedback loop comprises:
a third capacitor coupled between the third gain stage output and a feedback gain stage input;
a feedback gain stage having the feedback gain stage input and a feedback gain stage output coupled to the third gain stage input and configured to apply a feedback gain to a signal present at the feedback gain stage input; and
a resistor coupled between the feedback gain stage input and ground.

7. The integrated circuit of claim 6, wherein the feedback gain is a transconductance gain, wherein the resistor has a resistance equal to an inverse of a gain of the feedback gain.

8. The integrated circuit of claim 5, wherein the first gain and the second gain are each a non-inverting gain and the third gain is an inverting gain.

9. A personal audio device comprising:
an audio transducer configured to generate sound in accordance with an output signal received by the audio transducer;
a signal path coupled to the audio transducer, wherein the signal path comprises:
a first path portion comprising a transconductance with capacitances feedback compensation amplifier having:
a first gain stage having a first gain stage input and a first gain stage output and configured to receive an analog input signal at the first gain stage input and apply a first gain to the input signal to generate a first gain stage output signal at the first gain stage output;
a second gain stage having a second gain stage input and a second gain stage output and configured to receive the first gain stage output signal at the second gain stage input and apply a second gain to the first gain stage output signal to generate a second gain stage output signal at the second gain stage output;
a third gain stage having a third gain stage input and a third gain stage output and configured to receive the second gain stage output signal at the third gain stage input and apply a third gain to the second gain stage output signal to generate the output signal at the third gain stage output,
wherein each of the first gain, the second gain, and the third gain comprises a transconductance gain;
an outer feedback loop comprising a first capacitor coupled between the second gain stage input and the third gain stage output;
an inner feedback loop coupled between the third gain stage input and the third gain stage output and configured to provide cascade compensation between the third gain stage input and the third gain stage output; and
a second capacitor in parallel with the inner feedback loop and coupled between the third gain stage input and the third gain stage output; and
a second path portion configured to convert a digital input signal into the analog input signal.

10. The personal audio device of claim 9, wherein the inner feedback loop comprises:
a third capacitor coupled between the third gain stage output and a feedback gain stage input;
a feedback gain stage having the feedback gain stage input and a feedback gain stage output coupled to the third gain stage input and configured to apply a feedback gain to a signal present at the feedback gain stage input; and
a resistor coupled between the feedback gain stage input and ground.

11. The personal audio device of claim 10, wherein the feedback gain is a transconductance gain, wherein the resistor has a resistance equal to an inverse of a gain of the feedback gain.

12. The personal audio device of claim 9, wherein the first gain and the second gain are each a non-inverting gain and the third gain is an inverting gain.

13. A method comprising:
applying a first gain to an input signal to generate a first gain stage output signal at a first gain stage output of a first gain stage having a first gain stage input and the first gain stage output;
applying a second gain to the first gain stage output signal to generate a second gain stage output signal at a second gain stage output of a second gain stage having a second gain stage input and the second gain stage output;
applying a third gain to the second gain stage output signal to generate a third gain stage output signal at a third gain stage output of a third gain stage having a third gain stage input and the first gain stage output, wherein each of the first gain, the second gain, and the third gain comprises a transconductance gain;
applying a first feedback between the second gain stage input and the third gain stage output with a first capacitor;
applying a second feedback between the third gain stage input and the third gain stage output and using cascade compensation between the third gain stage input and the third gain stage output; and
applying compensation with a second capacitor in parallel with the inner feedback loop and coupled between the third gain stage input and the third gain stage output.

14. The method of claim 13, wherein the first feedback is applied by a feedback loop comprising:
a third capacitor coupled between the third gain stage output and a feedback gain stage input;
a feedback gain stage having the feedback gain stage input and a feedback gain stage output coupled to the third gain stage input and configured to apply a feedback gain to a signal present at the feedback gain stage input; and a resistor coupled between the feedback gain stage input and ground.

15. The method of claim 14, wherein the feedback gain is a transconductance gain, wherein the resistor has a resistance equal to an inverse of a gain of the feedback gain.

16. The method of claim 13, wherein the first gain and the second gain are each a non-inverting gain and the third gain is an inverting gain.

* * * * *

UNITED STATES PATENT AND TRADEMARK OFFICE
CERTIFICATE OF CORRECTION

PATENT NO. : 9,941,848 B1
APPLICATION NO. : 14/520060
DATED : April 10, 2018
INVENTOR(S) : Zanbaghi et al.

Page 1 of 1

It is certified that error appears in the above-identified patent and that said Letters Patent is hereby corrected as shown below:

In the Specification

Please amend the paragraph beginning at Line 12 of Column 4 as follows:
FIGURE 2 is a block diagram of selected components of an example audio IC 9 of a personal audio device, in accordance with embodiments of the present disclosure. As shown in FIGURE 2, a microcontroller core 18 may supply a digital audio input signal DIG_IN to a digital-to-analog converter (DAC) 14, which may convert the digital audio input signal to an analog signal $V_{IN}$. DAC 14 may be referred to herein as a digital path portion of the signal path from the input node for digital audio input signal DIG_IN to the output node for output voltage signal $V_{OUT}$ depicted in FIGURE 2.

Please amend the paragraph beginning at Line 23 of Column 4 as follows:
DAC 14 may supply analog signal $V_{IN}$ to an amplifier stage 16 which may amplify or attenuate audio input signal $V_{IN}$ in conformity with a gain to provide an audio output signal $V_{OUT}$, which may operate a speaker, headphone transducer, a line level signal output, and/or other suitable output. Amplifier stage 16 may be referred to herein as an analog path portion of the signal path from the input node for digital audio input signal DIG_IN to the output node for output voltage signal $V_{OUT}$ depicted in FIGURE 2. In the relevant art, amplifier stage 16 may sometimes be referred to as an audio expander. In some embodiments, amplifier stage 16 may comprise a TCFC amplifier, such as TCFC amplifier 30 shown in FIGURE 3. In FIGURE 2, a capacitor CO may be utilized to couple the output signal to the transducer or line level output, particularly if amplifier stage 16 is operated from a unipolar power supply having a quiescent voltage substantially differing from ground. A power supply 10 may provide the power supply rail inputs of amplifier stage 16.

Signed and Sealed this
Twelfth Day of February, 2019

Andrei Iancu
*Director of the United States Patent and Trademark Office*